United States Patent
Gieseke

(10) Patent No.: US 6,433,389 B1
(45) Date of Patent: Aug. 13, 2002

(54) SILICON ON INSULATOR LOGIC CIRCUIT UTILIZING DIODE SWITCHING ELEMENTS

(75) Inventor: Bruce Alan Gieseke, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 47 days.

(21) Appl. No.: 09/591,117

(22) Filed: Jun. 9, 2000

(51) Int. Cl.[7] .................. H01L 27/01; H01L 31/0392
(52) U.S. Cl. ................... 257/347; 257/350; 257/352; 257/354
(58) Field of Search ................... 257/347, 350, 257/352, 353, 354; 327/566, 535, 390; 326/88, 92

(56) References Cited

U.S. PATENT DOCUMENTS

| 3,244,903 A | 4/1966 | Brian |
| 5,521,538 A | 5/1996 | Dickinson |
| 6,072,353 A | * 6/2000 | Matsuzawa |

FOREIGN PATENT DOCUMENTS

EP  0 724 295  1/1996

OTHER PUBLICATIONS

C. Lu et al.: "Soi for Digital Cmos VLSI Design Considerations and Advances"; vol. 86 No. 4 Apr. 1, 1998.
P. Hsueh et al.: "Bicmos Driver with Latch"; vol. 12, Apr. 1, 1991.
F. Vogt et al.: "Smart Power with 1200V DMOS"; vol. Conf. 9, May 26, 1997.
International Search Report for Application No. PCT/US0110921 dated Oct. 9, 2001.

* cited by examiner

Primary Examiner—Minh Loan Tran
(74) Attorney, Agent, or Firm—Renner, Otto, Boisselle & Sklar

(57) ABSTRACT

A logic circuit is formed on a silicon on insulator (SOI) substrate in the thin silicon layer above the insulating buried oxide layer. The logic circuit utilizes both SOI field effect transistors (FETs) and SOI diodes to provide for reduced size of the logic circuit and reduced power consumption when the logic circuit is in operation. A method of performing certain logic function is also provided.

13 Claims, 4 Drawing Sheets

| INPUT 12 | CLOCK 20 | RAIL 30 | OUTPUT 15 |
|---|---|---|---|
| ALL LOW | L | H | L |
| ALL LOW | H | H | L |
| AT LEAST 1 HIGH | L | H | L |
| AT LEAST 1 HIGH | H | L | H |

SILICON ON INSULATOR LOGIC CIRCUIT UTILIZING DIODE SWITCHING ELEMENTS

TECHNICAL FIELD

The present invention generally relates to the design of logic circuits for use with silicon-on-insulator (SOI) technology, and more particularly, to the use of diode switching elements in such logic circuits.

BACKGROUND OF THE INVENTION

Conventional or bulk semiconductor transistors are formed in a semiconductor substrate by implanting a well of either P-conductivity or N-conductivity silicon in a silicon substrate wafer of the opposite conductivity. Gates and source/drain diffusions are then manufactured using commonly known processes. These form devices known as metal-oxide-semiconductor (MOS) field effect transistors (FETs). Each of these FETs must be electrically isolated from the others in order to avoid shorting the circuits. These FET's are typically interconnected through metal layers above the bulk substrate to form logic devices including inverters, inverting switches, NAND gates and others. Typically, the interconnections will be structured to interconnect both P-Channel and N-Channel FET's in accordance with known complimentary metal oxide semiconductor (CMOS) techniques to minimize power consumption. The logic devices are interconnected to form logic circuits including different degrees of fan-in and fan-out for example.

Diodes theoretically may be used to perform certain functionality in logic circuits. However, bulk semiconductor logic circuits typically do not use diodes. Bulk semiconductor diodes are formed in wells and occupy a surface area equivalent or larger than that of a FET. Furthermore, their capacitive and resistive characteristics increase power consumption and reduce performance (e.g. maximum clock speed) making them inferior to equivalent circuit function utilizing bulk semiconductor FETs. For example, a bulk semiconductor diode 10 shown in FIG. 1 includes an N-conductivity cathode 14 surrounded by P-conductivity anode 12 which is implanted in a N-conductivity well 16 formed in a P-conductivity substrate 18. In operation, a current can flow from the anode 12 to the cathode 14 when diode 10 is forward biased. To obtain proper electrical characteristics, the mechanical geometry of the anode 12, cathode 14 and well 16 are such that the diode 10 is typically larger than a FET.

Even utilizing bulk semiconductor FETs for logic circuits have a drawback in that a relatively large amount of surface area is needed for the electrical isolation of the various FETs. This is undesirable for the current industry goals for size reduction. Additionally, junction capacitance between the source/drain and the bulk substrate and "off" state leakage from the drain to the source increase power consumption. Junction capacitance also effects performance in that it slows the speed at which a device using such transistors can operate. These problems result in difficulties in reducing the size, power consumption, and voltage of CMOS technology devices.

There continues to exist a strong continuing need in the art for the reduction in size and power consumption of logic. Accordingly, there is a strong need in the art a logic circuit that provides for reduced size and power consumption over known logic circuits.

SUMMARY OF THE INVENTION

A first aspect of this invention is to provide a logic circuit on a substrate having at least one silicon-on-insulator region with a thin semiconductor layer over an insulating layer of buried oxide. A plurality of logic gates are formed in the at least one silicon-on-insulator region and a plurality of silicon on insulator diodes are formed in the at least one silicon-on-insulator region and operatively coupled among at least one of input terminals and output terminals of the plurality of logic gate to control logic state switching among the plurality of logic gates. The logic circuit may further include an output rail wherein at least one silicon on insulator diode is coupled between the output terminal of at least one logic gate and the logic circuit output rail providing a forward biased current path from the logic circuit output rail to the output terminal of the logic gate. The logic circuit may yet further include a switch, driven by a clock signal, coupling the logic circuit output rail to a logic high source when the clock signal is logic low and isolating the logic circuit output rail from the logic high source when the clock signal is logic high. Preferably, the switch is an inverting switch comprising two SOI FETs and the logic gate is a NAND gate including a first input coupled to the clock signal and a second input coupled to a logic circuit input signal. The NAND gate may comprise four field effect transistors and provide for a forward biased current through the SOI diode to sink to ground through at least one of said field effect transistors.

The logic circuit may further include a second NAND gate including a first input coupled to the clock signal and a second input coupled to a second logic circuit input signal, and a second SOI diode coupled between an output terminal of the second NAND gate and the logic circuit output rail providing a forward biased current path from the logic circuit output rail to the output terminal of the second NAND gate. The logic circuit may further yet include an inverter with an input coupled to the logic circuit output rail and having an output that is a logic OR function of the first logic circuit input signal and the second logic circuit input signal.

A second aspect of the present invention is to provide a method of performing a logic calculation on a silicon-on-insulator circuit, the method comprising a) generating a plurality of first signals at the output terminal of a plurality of logic gates; and b) coupling the logic signals to a silicon on insulator switching diode functioning as an open switch to current flow from the output terminal and as a closed switch to enable current flow into the output terminal. The method may further include coupling an output rail to each of the diodes and to a logic high source when a clock signal is logic low and isolating the output rail from the logic high source when the clock signal is logic high, wherein each first signal corresponds to a NAND function of a corresponding one of a plurality of input signals and the clock signal such that the output rail is a logic NOR function of the plurality of input signals. The method may further yet include coupling the output rail to an inverter to generate an output signal that is logic high when the output rail is logic low and is logic low when the output rail is logic high.

A third aspect of the present invention is to provide a method of forming a logic circuit in a silicon-on-insulator wafer comprising forming a plurality of SOI FETs and a plurality of SOI diodes in a thin silicon layer over a buried oxide layer in said wafer, and interconnecting the plurality of SOI FETs and SOI diodes to form a plurality of logic gates with an output coupled to a cathode of each of the plurality of SOI diodes to isolate each of the logic gates from a logic low sink on an anode side of the SOI diode connected thereto and to sink a logic high charge on the anode side of the SOI diode to a logic low sink through the logic gate.

The step of interconnecting the plurality of SOI FETs and SOI diodes may further include coupling the anodes of a plurality the plurality of diodes to an output rail and forming an inverting switch coupling the output rail to a logic high source when a clock signal is logic low and isolating the output rail from the logic high source when the clock signal is logic high. The step of interconnecting the plurality of SOI FETs and SOI diodes may further yet include forming an inverter coupling the output rail to an output port such that the output port is logic high when the output port is logic low and the output port is logic low when the output rail is logic high.

A fourth aspect of the present invention is to provide a logic circuit comprising a substrate having at least one silicon-on-insulator region with a thin semiconductor layer over an insulating layer of buried oxide. A plurality of diodes may be formed in the at least one silicon-on-insulator region, each diode including an anode and a cathode and operating as a logic element between a logic high potential and a logic low potential to: i) pull logic high on the anode to logic low in the event that the cathode is pulled to logic low; and ii) maintain logic high on the cathode independent of whether the anode is pulled to logic low. The logic circuit may further comprise plurality of logic gates formed in the at least one silicon-on-insulator region. The logic gates may be operatively coupled among the plurality of diodes to pull at least one of the anode and the cathode of at least one of the plurality of diodes to at least one of logic high and logic low.

DESCRIPTION OF THE PREFERRED EMBODIMENTS

Figure 1:
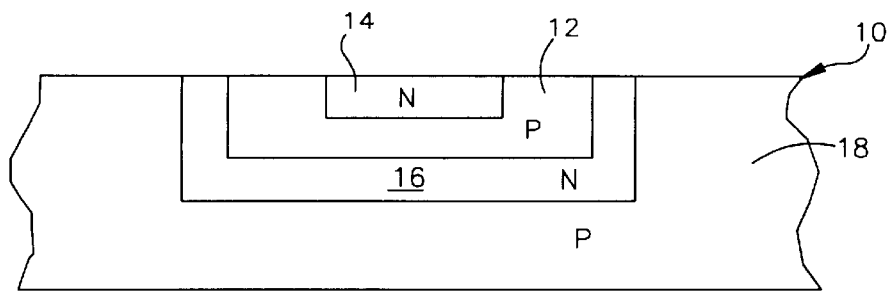
FIG. 1 is a cross sectional view of a conventional diode.

The present invention will now be described in detail with reference to the drawings. In the drawings, like reference numerals are used to refer to like elements throughout.

Figure 2:
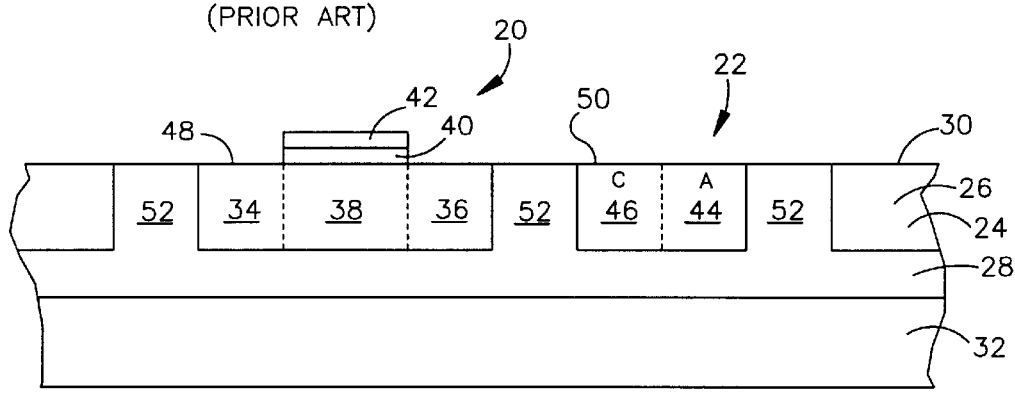
FIG. 2 is a cross sectional view of an SOI FET and SOI diode in accordance with one embodiment of this invention.

Referring to FIG. 2, both an exemplary SOI FET 20 structure and an SOI diode 22 structure in accordance with this invention are shown. An SOI substrate 24 includes a thin silicon layer 26 over an insulating buried oxide layer 28 at a predetermined depth below the surface 30. The insulating buried oxide layer 28 separates the thin silicon layer 26 from the silicon substrate 32.

The SOI FET 20 includes a source region 34 and drain region 36 of a first semiconductor conductivity on opposing sides of a channel region 38 of the opposite semiconductor conductivity in a FET island 48. The channel region 38 is defined by a gate oxide layer 40 and a polysilicon gate 42. The FET island 48 is separated from other structures formed in the thin silicon layer 26 by insulating trenches 52. It is recognized in the art that an SOI FET 20 will occupy less surface area on the substrate and, because it is isolated from the silicon substrate by the insulating buried oxide layer 28, will have a lower junction capacitance than an equivalent bulk semiconductor FET.

The SOI diode 22 includes an anode 44 and a cathode 46 in a diode island 50 which is smaller than FET island 48. Because the SOI diode 22 is isolated from the silicon substrate 32 by the insulating buried oxide layer 28 and from FET 20 (and other structures formed in the thin silicon layer 26) by insulating trenches 52, it will not suffer the same magnitude of parasitic junction capacitance as an equivalent bulk semiconductor diode because the semiconductor junction area is limited to the plane between the anode 44 and the cathode 46. Furthermore, the total size of the SOI diode 22 is significantly smaller than an equivalent bulk semiconductor diode because trench region 52 requires less surface area to isolate SOI diode 22 than a bulk semiconductor well for isolation. Consequently, the combination of SOI FET 20 structure and SOI diode 22 structure provides for the ability to put larger logic circuits in less space and operate such circuits at faster clock speeds with lower power consumption then conventional logic circuits.

Figure 3:
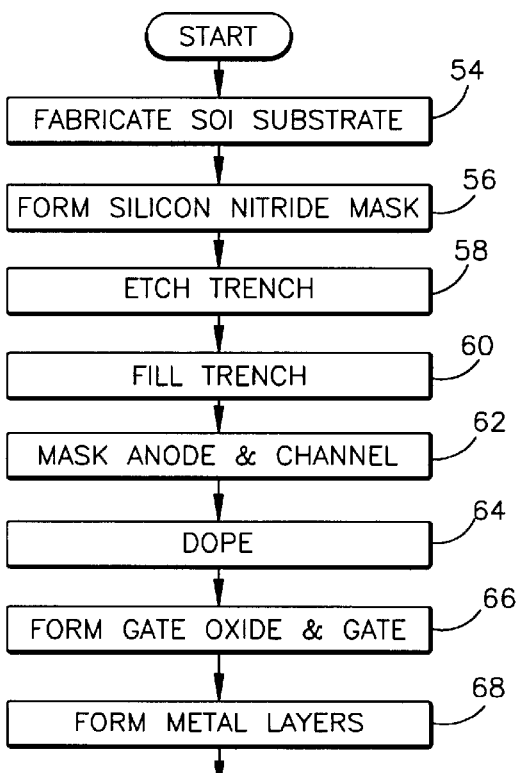
FIG. 3 is a flow chart showing an exemplary process for fabricating an SOI FET and an SOI diode in accordance with one embodiment of this invention.

Referring to the flowchart of FIG. 3 and the diagrams of FIGS. 4(a), 4(b), 4(c) and 4(d), an exemplary process for fabricating SOI FETs and diodes is shown. At step 54, an SOI substrate 24 is formed. The SOI substrate 24 includes an insulating buried oxide layer 28 with a thin silicon layer 26 on the top of the buried oxide layer 28 and a silicon substrate 32 below. The SOI substrate 24 may be formed using conventional bonded wafer techniques or using conventional Separation by Implantation of Oxygen (SIMOX) techniques. An ION beam is used to implant a high dose of oxygen, greater than $1 \times 10^{16}$ atoms per square centimeter, into the silicon substrate 24. The dose and beam energy parameters of the SIMOX process are controlled to control a resultant gaussian concentration of oxygen implanted in the substrate as a function of depth below the surface. Typically the dose and beam energy are selected such that the highest concentration of implanted oxygen (e.g. the peak of the gaussian distribution) is at the desired depth of the buried oxide layer 28 and lower concentrations exist both above and below the high concentration layer. A heat treatment then bonds the implanted oxygen with the silicon to form silicon dioxide (e.g. the high concentration layer becomes the buried oxide layer).

Figure 4A:
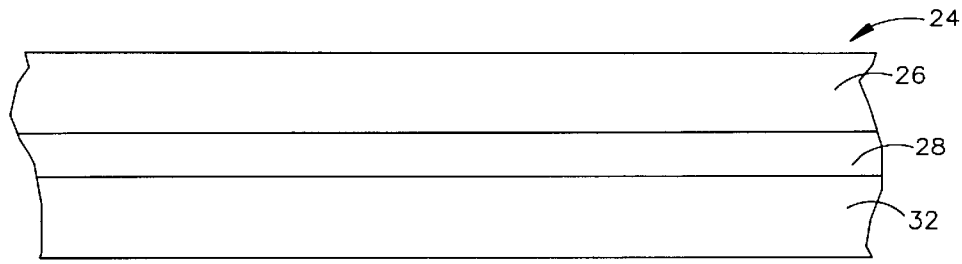
FIG. 4(a) is a cross sectional view of an exemplary silicon-on-insulator wafer in accordance with one embodiment of this invention.
Figure 4B:
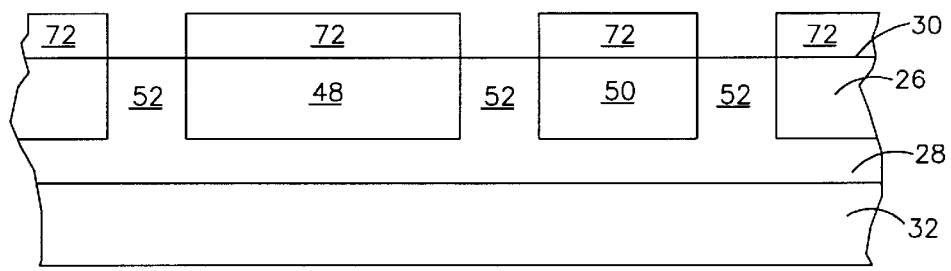
FIG. 4(b) is a cross sectional view of a first step in the fabrication of devices on a silicon-on-insulator wafer in accordance with one embodiment of this invention.

At step 56, conventional photolithography techniques are used to form a silicon nitride mask 72 to define and protect FET island 48 and diode island 50 while forming insulating trenches 52 there between as shown in FIG. 4(b). The silicon nitride mask 72 is formed by depositing a layer of silicon nitride, approximately 1,500–2,000 Angstroms thick, on the top surface 30 of the SOI substrate 24 and patterning and etching the silicon nitride using conventional photolithography techniques wherein 1) a layer of a UV sensitive photoresist compound is applied to the surface of the silicon nitride; 2) UV light is used to image a pattern from a reticle onto the photoresist; 3) A developer solution hardens the unexposed areas of the photoresist while the UV light dissolves and the developer washes away the exposed portions thereby leaving the unexposed portions as a mask on the surface of the silicon nitride; and 4) a dry etch with an etching compound that etches silicon nitride while not etching the photoresist removes the silicon nitride layer in the areas that are not masked with the photoresist thereby creating the silicon nitride mask 72 below the photoresist mask.

Figure 4C:
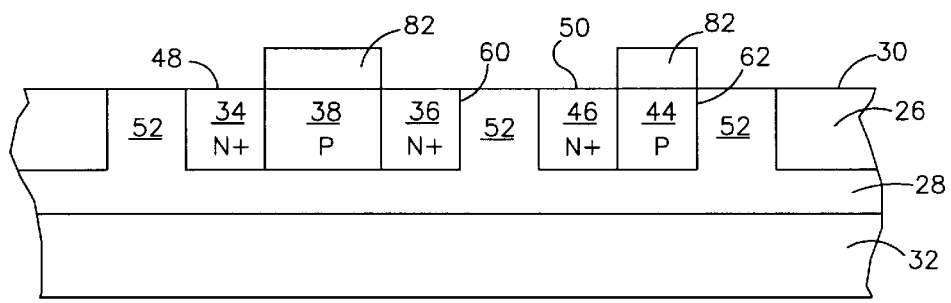
FIG. 4(c) is a cross sectional view of a second step in the fabrication of devices on a silicon-on-insulator wafer in accordance with one embodiment of this invention.

At step 58, insulating trenches 52 are etched into the thin silicon layer 26 using an anisotrpopic etch with a compound such as Hydrogen Bromide (HBr) as shown in FIG. 4(b). At step 60, the insulating trenches 52 are back-filled with insulating silicon dioxide to completely isolate each SOI FET island 48 and SOI diode island 50 from other islands (not shown) formed in the thin silicon layer 26 as shown in FIG. 4(c). Conventional back-filling techniques may be used including filling the trenches with SiH4 or TEOS and subsequently oxidizing either of such compounds to form insulating silicon dioxide. After filling the insulating trenches 52, the surface 30 of the substrate is polished using a chemical mechanical polish to remove any excess silicon dioxide layer and the remaining silicon nitride mask.

Following the isolation of the FET island 48 and the diode island 50 in step 60, in step 62, a photoresist mask 82 is applied to the surface 30 of the FET island 48 and the diode island 50 to define and mask the channel region 38 between the source region 34 and a drain region 36 in the FET island 48 and to define and mask the anode 44 in the diode island 50 as shown in FIG. 4(c). At step 64, a donor dopant, such as arsenic, is implanted in the unmasked cathode 46, source region 34, and drain region 36 to create N conductivity silicon in such regions. Thereafter, the photoresist mask 82 is removed.

Figure 4D:
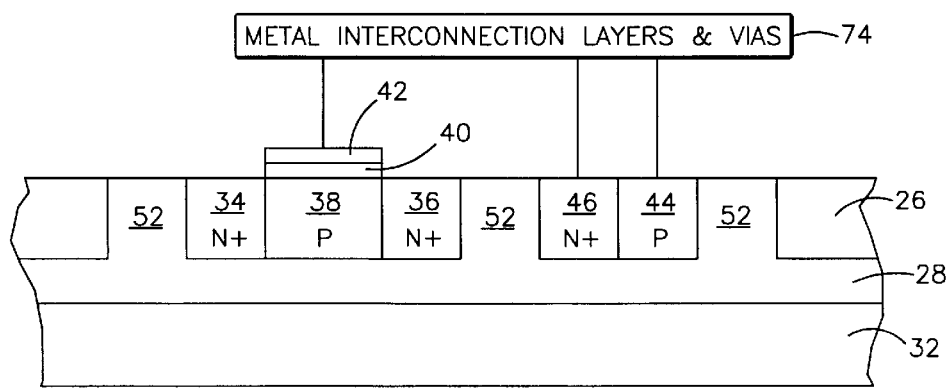
FIG. 4(d) is a cross section diagram of a field effect transistor and a diode formed adjacent to each other in an SOI wafer in accordance with one embodiment of this invention.

At step 66, a gate oxide layer 40, and a polysilicon gate 42 are formed on the top surface 30 over the channel region 38. The gate oxide layer 40 is typically grown on the surface using a thermal oxidation process and a polysilicon layer is deposited on top of the gate oxide layer 40 using a low pressure chemical vapor deposition (LPCVD) process. The polysilicon layer is then patterned and etched using the photolithography method discussed earlier to create polysilicon gate 42 over the channel region 38 of the FET 10 as shown in FIG. 4(d).

In step 68, Metal layers and vias 74 are fabricated on the silicon substrate 32 to interconnect the SOI FET (source region 34, drain region 36 and gate 42), SOI diode (anode 44 and cathode 46), and other similar structures formed on the silicon layer 26 to form the logic circuits using known techniques.

Figures 5, 6:
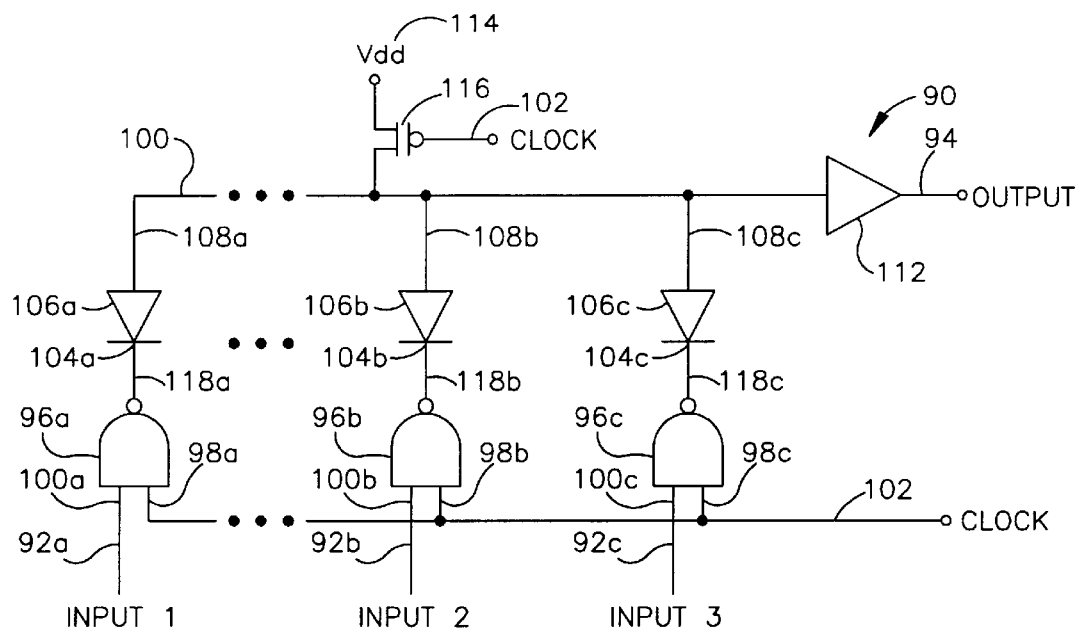
FIG. 5 is a logic diagram of an exemplary diode switched logic circuit in accordance with one embodiment of this invention.
FIG. 6 is a table summarizing the logic function of the exemplary diode switched logic circuit of FIG. 5.

Referring to FIG. 5, and exemplary diode switched logic circuit 90 made in accordance with this invention is shown. The basic structure and steps described above in relation to forming one or more FETs and Diodes in SOI are applied in constructing the logic circuit 90 as will be appreciated by those having ordinary skill in the art. The logic circuit 90 includes multiple input terminals 92a, 92b, and 92c, an output terminal 94 and functions to fan-in the multiple input terminals 92a, 92b, and 92c and generate a logic OR function thereof at output terminal 94. The logic circuit 90 includes a plurality of NAND gates 96a, 96b, and 96c, each including a first input terminal 100a, 100b, and 100c coupled to a corresponding input terminal 92a, 92b, and 92c and a second input terminal 98a, 98b, and 98c coupled to a clock signal 102. An output terminal 118, 118b, and 118c on each NAND gate 96 couples to a cathode 104a, 104b, and 104c of a corresponding diode switch 106a, 106b, and 106c. An anode 108a, 108b, and 108c of each diode switch 106a, 106b, and 106c couples to an output rail 110. The output rail 110 is coupled to the output terminal 94 through a receiver 112, which could be an inverter or an amplifier, and is coupled to a logic high source 114 (e.g. Vdd potential) through an inverting switch 116 which is driven by clock signal 102.

It should be appreciated that each diode switch 106, operating as a logic element, functions to pull logic high (e.g. Vdd potential) on anode 108 to logic low (e.g. ground potential) in the event that the cathode 104 is pulled to logic low. However, diode switch 106 functions to maintain logic high on cathode 104 independent of whether the anode 108 is pulled to logic low.

In operation, while the clock signal 102 is logic low, the inverting switch 116 is closed such that the output rail 110 is coupled to the logic high source 114 and the output terminal 118a, 118b, and 118c of each NAND gate 96a, 96b, and 96c is logic high. As such the potential of output rail 110 is logic high and there is no current flow through any of diode switches 106a, 106b, and 106c. The output terminal 94 coupled to the output rail 110 through receiver 112 is logic low.

When the clock signal 102 goes logic high, inverting switch 116 opens to isolate the output rail 110 from the logic high source 114. Simultaneously, if any one of the inputs 92a, 92b, and 92c is logic high, the NAND gate 106 corresponding thereto will have an output of logic low at its output terminal 118. As such, the logic high charge on output rail 110 will sink to logic low though the forward biased diode switch 106 coupled to the logic low NAND gate output terminal 118 and the output terminal 94 of the logic circuit 90 will be logic high generating the OR function of all of the inputs terminals 92a, 92b, and 92c. Similarly, if all of the input terminals 92a, 92b, and 92c remain logic low when the clock signal 102 goes logic high, the output terminal 118a, 118b, and 118c of each NAND gate 96a, 96b, and 96c will remain logic high. As such logic high potential on the output rail 110 will not sink to logic low and the output terminal 94 will remain logic low. A table 120 summarizing the logic OR function of logic circuit 90 is shown in FIG. 6.

Referring again to FIG. 5, it should be appreciated that when the clock signal 102 is logic low, the output rail 110 is coupled to the logic high source 114 through inverting switch 116 but the output terminals 118a, 118b, and 118c of all NAND gates 96a, 96b, and 96c will also be logic high so that while the output rail 110 is logic high, no current flows through the output rail 110. Similarly, when the clock signal 102 is logic high, one of the NAND gates 96a, 96b, and 96c may provide a path for the logic high charge on the output rail 110 to sink to logic low but, because the inverting switch 116 is open when the clock signal 102 is logic high, no current flows through the output rail 110. As such, the logic circuit 90 if this invention provides for extremely low power consumption because there is never a time when a closed circuit exists to permit current flow between the logic high source (e.g. Vdd) and a logic low source (e.g Ground).

Figure 7:
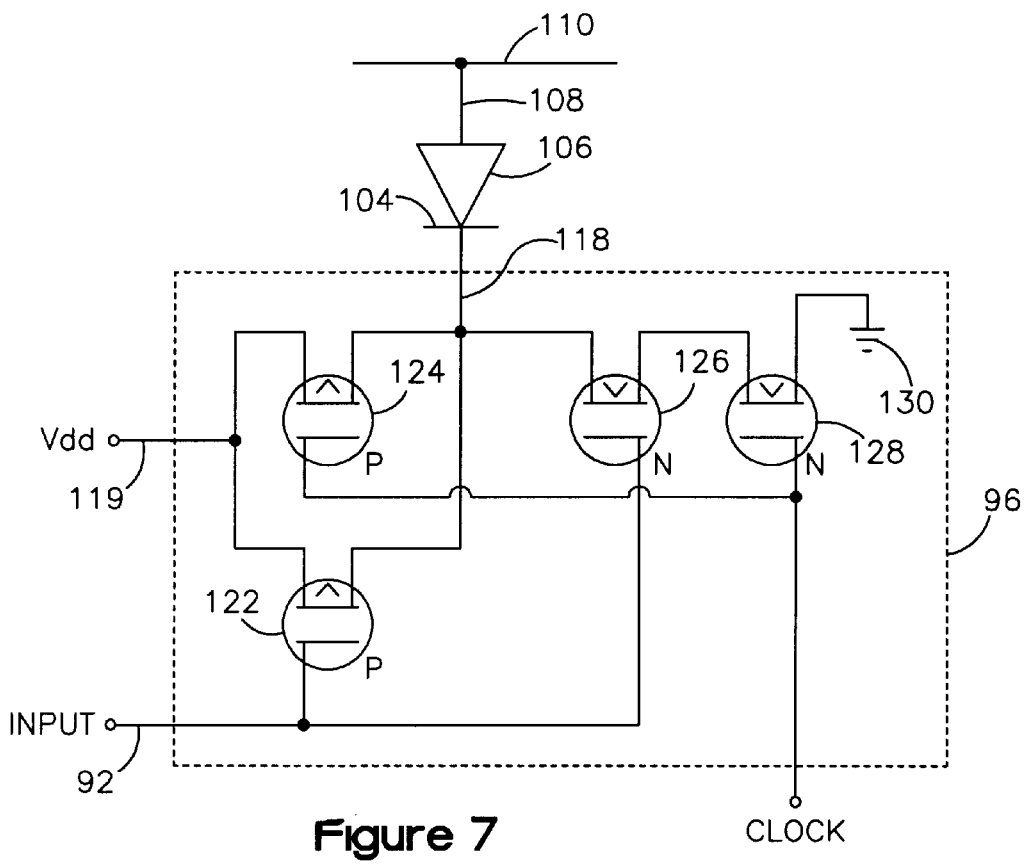
FIG. 7 is a circuit diagram of one portion of the exemplary diode switched logic circuit of FIG. 5.

Referring to FIG. 7, each NAND gate 96 includes a first P-channel transistor 122, a second P-channel transistor 124, a first N-channel transistor 126 and a second N-channel transistor 128. As is known in the art, an N-channel transistor functions as a closed switch when the gate input is logic high and an open switch when the gate input it logic low. Similarly, a P-channel transistor functions as an open switch when the gate input is logic high and a closed switch when the gate input is logic low. Therefore, P-channel transistor 122, which has its gate driven by input signal 92, is wired in parallel with P-channel transistor 124, which has its gate driven by clock signal 102, such that output terminal 118 will be coupled to the logic high source if either of input signal 92 or clock signal 102 is logic low. N-channel transistor 126, which has its gate driven by input signal 92, is wired in series with N-channel transistor 128, which has its gate driven by clock signal 102, such that output terminal 118 will be coupled to a logic low source 130 only if both the clock signal 102 and the input signal 92 are logic high. As such, the output terminal 118 of the NAND gate 96 will remain logic high unless both the input terminal 92 and the clock signal 102 are both logic high. At such time, output terminal 118 will be logic low. When output terminal 118 is logic low, the diode switch 106 is forward biased to permit a logic high charge on output rail 110 to sink to logic low through transistors 126 and 128. As such, the potential of output rail 110 will be pulled to logic low when the output of any NAND gate 96a, 96b and 96c is logic low.

It should be appreciated that the only situation when the output terminal 118 is coupled to the logic low source 130 is when both the clock 102 and the input 92 are both logic high. And, in that situation, both P-channel transistors 122 and 124 are open switches such that output terminal 118 is isolated from the logic high source 114 such that there is never a time when a closed circuit exists for current flow from the logic high source 114 to the logic low source 130.

Figure 8:
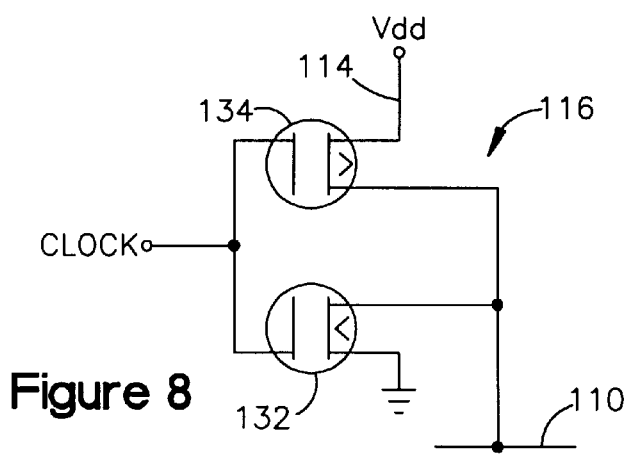
FIG. 8 is a circuit diagram of a second portion of the exemplary diode switched logic circuit of FIG. 5.

Referring to FIG. 8, it can be seen that inverting switch 116 comprises an N-channel transistor 132 and a P-channel transistor 134. As such, it should be appreciated that output rail 110 will be coupled to the logic high source 114 (e.g. Vdd) when the clock signal 102 is logic low and will be isolated from the logic high source 114 when the clock signal 102 is logic high.

The diode switch in the exemplary diode switch logic circuit functions as a closed switch in a forward biased to permit a logic high potential to sink to a logic low potential. The diode switch functions as an open switch in a reverse bias or non-bias to isolate a portion of the circuit with a logic high potential. As such, it is contemplated by this invention that a diode switch can be used in any logic circuit wherein the inputs and/or outputs one or more logic gates, including NAND, AND, OR, and NOR gates for example, are coupled together and preferably are isolated to prevent a closed circuit current path from a logic high gate input and/or output to a logic low gate input/and or output.

The logic circuit of this invention utilizes a silicon on insulator substrate and both SOI FETs and SOI diode switched to achieve both size reduction and power reduction over conventional logic circuits. Although the invention has been shown and described with respect to certain preferred embodiments, it is obvious that equivalents and modifications will occur to others skilled in the art upon the reading and understanding of the specification. For example, the described embodiment relates to an N-Channel FET while those skilled in the art will readily be able to apply the teachings of this invention to a P-Channel FET. The present invention includes all such equivalents and modifications, and is limited only by the scope of the following claims.

What is claimed is:

1. A logic circuit, comprising:
    a) a substrate having a plurality of silicon-on-insulator regions within a thin semiconductor layer over an insulating layer of buried oxide;
    b) a plurality of logic gates formed among some of the plurality of silicon-on-insulator regions;
    c) a plurality of silicon on insulator diodes formed on others of the plurality of silicon-on-insulator regions and operatively coupled to an input terminal or an output terminal of at least one of the plurality of logic gates to control logic state switching among the plurality of logic gates.

2. The logic circuit of claim 1, further including a logic circuit output rail wherein at least one silicon on insulator diode is coupled between the output terminal of at least one logic gate and the logic circuit output rail providing a forward biased current path from the logic circuit output rail to the output terminal of the logic gate.

3. The logic circuit of claim 2, further including a switch, driven by a clock signal, coupling the logic circuit output rail to a logic high source when the clock signal is logic low and isolating the logic circuit output rail from the logic high source when the clock signal is logic high.

4. The logic circuit of claim 3, wherein the switch is an inverting switch comprising two SOI FETs.

5. The logic circuit of claim 4, wherein the logic gate is a NAND gate including a first input coupled to the clock signal and a second input coupled to a logic circuit input signal.

6. The logic circuit of claim 5, wherein the NAND gate comprises four field effect transistors and provides for a forward biased current through the SOI diode to sink to ground through at least one of said field effect transistors.

7. The logic circuit of claim 6, further comprising:
    a) a second NAND gate including a first input coupled to the clock signal and a second input coupled to a second logic circuit input signal; and
    b) a second SOI diode coupled between an output terminal of the second NAND gate and the logic circuit output rail providing a forward biased current path from the logic circuit output rail to the output terminal of the second NAND gate.

8. The logic circuit of claim 7, further comprising an inverter with an input coupled to the logic circuit output rail and having an output that is a logic OR function of the first logic circuit input signal and the second logic circuit input signal.

9. A method of forming a logic circuit in a silicon-on-insulator wafer comprising:
    a) forming a plurality of SOI FETs and a plurality of SOI diodes in a thin silicon layer over a buried oxide layer in said wafer; and
    b) interconnecting the plurality of SOI FETs and SOI diodes to form a plurality of logic gates each with an output coupled to a cathode of each of the plurality of SOI diodes to isolate each of the logic gates from a logic low sink on an anode side of the SOI diode connected thereto and to sink a logic high charge on the anode side of the SOI diode to a logic low sink through the logic gate.

10. The method of forming a logic circuit on a silicon-on-insulator wafer of claim 9, wherein the step of interconnecting the plurality of SOI FETs and SOI diodes further includes coupling the anodes of a plurality the plurality of diodes to an output rail and forming an inverting switch coupling the output rail to a logic high source when a clock signal is logic low and isolating the output rail from the logic high source when the clock signal is logic high.

11. The method of forming a logic circuit on a silicon-on-insulator wafer of claim 10, wherein the step of interconnecting the plurality of SOI FETs and SOI diodes further includes forming an inverter coupling the output rail to an output port such that the output port is logic high when the output port is logic low and the output port is logic low when the output rail is logic high.

12. A logic circuit comprising:
   a) a substrate having a plurality of silicon-on-insulator regions within a thin semiconductor layer over an insulating layer of buried oxide;
   b) a plurality of diodes formed among some of the plurality of silicon-on-insulator regions, each diode including an anode and a cathode and operating as a logic element between a logic high potential and a logic low potential to:
      i) pull logic high on the anode to logic low in the event that the cathode is pulled to logic low; and
      ii) maintain logic high on the cathode independent of whether the anode is pulled to logic low.

13. The logic circuit of claim further comprising a plurality of logic gates formed in others of the plurality of silicon-on-insulator regions, the logic gates being operatively coupled among the plurality of diodes to pull at least one of the anode and the cathode of at least one of the plurality of diodes to at least one of logic high and logic low.

* * * * *